(12) United States Patent
Yoko

(10) Patent No.: US 10,553,266 B2
(45) Date of Patent: Feb. 4, 2020

(54) SEMICONDUCTOR DEVICE CHIP SELECTION

(71) Applicant: Longitude Semiconductor S.a.r.l., Luxembourg (LU)

(72) Inventor: Hideyuki Yoko, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 0 days.

(21) Appl. No.: 15/896,830

(22) Filed: Feb. 14, 2018

(65) Prior Publication Data

US 2018/0174631 A1 Jun. 21, 2018

Related U.S. Application Data

(63) Continuation of application No. 14/833,394, filed on Aug. 24, 2015, now Pat. No. 9,911,480, which is a continuation of application No. 14/186,775, filed on Feb. 21, 2014, now Pat. No. 9,123,399, which is a continuation of application No. 12/929,669, filed on Feb. 7, 2011, now Pat. No. 8,687,449.

(30) Foreign Application Priority Data

Jan. 28, 2011 (JP) ................ 2011-016003

(51) Int. Cl.
*G11C 8/12* (2006.01)
*G11C 5/04* (2006.01)
*G11C 11/408* (2006.01)
*G11C 5/06* (2006.01)
*G11C 11/4072* (2006.01)

(52) U.S. Cl.
CPC ............... *G11C 8/12* (2013.01); *G11C 5/04* (2013.01); *G11C 5/06* (2013.01); *G11C 11/408* (2013.01); *G11C 11/4072* (2013.01)

(58) Field of Classification Search
CPC ............... G11C 8/12; G11C 5/04; G11C 5/06
See application file for complete search history.

(56) References Cited

U.S. PATENT DOCUMENTS

| 7,057,950 | B2 * | 6/2006 | Lee | G11C 7/12 365/203 |
| 7,466,577 | B2 * | 12/2008 | Sekiguchi | G11C 5/02 257/686 |
| 8,031,505 | B2 * | 10/2011 | Kang | G11C 5/02 365/51 |
| 8,411,528 | B2 * | 4/2013 | Lee | G11C 5/00 365/189.05 |

(Continued)

*Primary Examiner* — Vanthu T Nguyen
(74) *Attorney, Agent, or Firm* — Kunzler Bean & Adamson

(57) ABSTRACT

A method for accessing a plurality of DRAM devices each having a plurality of banks, the plurality of DRAM devices being interconnected to receive common address and command signals. The method includes receiving a first chip selection address and a first bank address with an active command to activate a first bank in a first DRAM device of the plurality of DRAM devices. A first bank active flag is set, corresponding to the first bank address, in the first DRAM device of the plurality of DRAM devices. A second bank address with a column command is received. A second bank is accessed in a second DRAM device of the plurality of DRAM devices having a set bank active flag corresponding to the second bank address.

12 Claims, 14 Drawing Sheets

(56) References Cited

U.S. PATENT DOCUMENTS

| | | | |
|---|---|---|---|
| 8,547,775 B2* | 10/2013 | Yoko | G11C 5/063 365/189.05 |
| 2011/0085403 A1* | 4/2011 | Nishioka | G11C 5/02 365/230.03 |
| 2011/0242869 A1* | 10/2011 | Lee | H01L 25/0657 365/51 |

* cited by examiner

| I/O CONFIG | ROW ADDRESS | COLUMN ADDRESS | SEL | | | PAGE SIZE |
|---|---|---|---|---|---|---|
| | | | SEL2 | SEL1 | SEL0 | |
| 4DQ | A0~15 (X0~X15) | A0~9,11,13 (Y0~Y9,Y11,Y13) | Y13 | X15 | X14 | 1KB |
| 8DQ | A0~15 (X0~X15) | A0~9,11 (Y0~Y9,Y11,) | Y11 | X15 | X14 | 1KB |
| 16DQ | A0~15 (X0~X15) | A0~9 (Y0~Y9) | X15 | X14 | X13 | 2KB |

FIG.6

| I/O CONFIG | ROW ADDRESS | COLUMN ADDRESS | SEL | | | PAGE SIZE |
|---|---|---|---|---|---|---|
| | | | SEL2 | SEL1 | SEL0 | |
| 4DQ | A0~15 | A0~9,11 | — | X15 | X14 | 1KB |
| 8DQ | A0~15 | A0~9 | — | X15 | X14 | 1KB |
| 16DQ | A0~14 | A0~9 | — | X14 | X13 | 2KB |

FIG.13A

| I/O CONFIG | ROW ADDRESS | COLUMN ADDRESS | SEL | | | PAGE SIZE |
|---|---|---|---|---|---|---|
| | | | SEL2 | SEL1 | SEL0 | |
| 4DQ | A0~14 | A0~9,11 | — | — | X14 | 1KB |
| 8DQ | A0~14 | A0~9 | — | — | X14 | 1KB |
| 16DQ | A0~13 | A0~9 | — | — | X13 | 2KB |

FIG.13B

SEMICONDUCTOR DEVICE CHIP SELECTION

CROSS-REFERENCE TO RELATED APPLICATIONS

This application is a Continuation application of U.S. patent application Ser. No. 14/833,394, filed on Aug. 24, 2015, which is a Continuation application of U.S. patent application Ser. No. 14/186,775, filed on Feb. 21, 2014, now U.S. Pat. No. 9,123,399, issued on Sep. 1, 2015, which is a Continuation application of U.S. patent application Ser. No. 12/929,669, filed on Feb. 7, 2011, now U.S. Pat. No. 8,687,449, issued on Apr. 1, 2014, which claims priority to Japanese Patent Application 2011-016003, filed on Jan. 28, 2011, all of which are incorporated herein by reference in their entirety.

BACKGROUND OF THE INVENTION

1. Field of the Invention

The present invention relates to a semiconductor device and an information processing system including the same. More particularly, the present invention relates to a semiconductor device that includes plural core chips and an interface chip to control the cores and an information processing system including the same.

2. Description of the Related Art

A memory capacity that is required in a semiconductor memory device such as a dynamic random access memory (DRAM) has increased every year. In recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device (for example, memory controller) is included in each memory chip. For this reason, an area for a memory core in each memory chip is restricted to an area obtained by subtracting the area for the front end unit from a total chip area, and it is difficult to greatly increase a memory capacity for each chip (for each memory chip).

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that integrates the front end unit and the back end unit in individual chips and laminates these chips, thereby constituting one semiconductor memory device, is suggested (for example. Japanese Patent Application Laid-Open (JP-A) No. 2007-157266). According to this method, with respect to plural core chips each of which is integrated with the back end unit without the front end unit, it becomes possible to increase a memory capacity for each chip (for each core chip) because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor memory device that has a large memory capacity and a high operation speed as a whole.

However, this kind of semiconductor memory device is recognized as only one memory chip, in view of a controller. For this reason, when the plural core chips are allocated to one interface chip, how to perform an individual access to each core chip becomes a problem. In the case of the general multi-chip package, each memory chip is individually selected using a dedicated chip selection terminal (/CS) in each memory chip. Meanwhile, in the semiconductor memory device described above, since the chip selection terminal is provided in only the interface chip, each core chip cannot be individually selected by a chip selection signal.

In order to resolve this problem. JP-A No. 2007-157266 described above, a chip identification number is allocated to each core chip, a chip selection address is commonly provided from the interface chip to each core chip, and individual selection of each core chip is realized.

However, since the chip selection address that is described in JP-A No. 2007-157266 is not used in the common semiconductor memory device, compatibility with the semiconductor memory device according to the related art may be lost.

As a result of examinations made by the present inventor from the above viewpoint, the inventor has found that compatibility with conventional semiconductor memory devices can be maintained by using a part of address information for a chip selection signal. According to this configuration, it appears from a controller that an address space is simply enlarged. Therefore, an interface that is same as that for the conventional semiconductor memory devices can be used.

However, in a semiconductor memory device such as a DRAM, there is employed a system of performing a read operation or a write operation by performing a row access and a column access in this order. Therefore, a part of address information used as a chip selection signal is supplied at only one of timings of a row access and a column access. Accordingly, when a chip selection signal is supplied at a row access time, for example, a chip selection signal is not supplied at a column access time. Consequently, it is not possible to determine which one of core chips is selected at the column access time.

This problem of accessing does not occur when each core chip is divided into plural memory banks and also when each memory bank is configured across plural core chips as viewed from a memory controller. This is because a bank address signal for assigning a memory bank is supplied at both timings of the row access time and the column access time. That is, when chip activation information is held in a predetermined core chip when a predetermined memory bank in this predetermined core chip is selected at a row access time, a column access to the predetermined memory bank in the predetermined core chip can be performed even when a chip selection signal is not supplied at the column access time.

However, in a semiconductor memory device having plural memory banks, two or more memory banks can operate in parallel. Therefore, pieces of chip activation information can be simultaneously in an active state in plural core chips. Even in this case, an access failure does not occur because a bank address signal is supplied at the column access time. That is, in a core chip in which the chip activation information is in an active state, a column access is received regardless of the bank address signal. However, because a column access to a memory bank that is not in an active state becomes invalid, damaging of data or conflict of data does not occur.

However, because an invalid column access increases its power consumption, it is preferable to reduce power consumption by preventing such a column access. The above problem applies not only to a so-called semiconductor memory device such as a DRAM but also to a semiconductor device in general that includes a memory in a part thereof.

SUMMARY

In one embodiment, there is provided a semiconductor device comprising a plurality of semiconductor chips stacked each other, each of the semiconductor chips including a plurality of memory banks selectively activated based on a bank address signal, the semiconductor chips being connected to each other by penetration electrodes, wherein the semiconductor chips have mutually different chip identification information, the semiconductor chips receive in common an active command signal, the bank address signal, and a chip selection signal via the penetration electrodes, and each of the semiconductor chips includes a bank active register that holds activation information of a memory bank assigned by the bank address signal when the chip selection signal that is supplied together with the active command signal and the bank address signal matches the chip identification information.

In another embodiment, there is provided a semiconductor device comprising a plurality of core chips that can perform a read operation or a write operation by performing a row access and a column access in this order, and an interface chip that controls the core chips, wherein each of the core chips includes a plurality of memory banks selectively activated based on a bank address signal, the core chips have mutually different chip identification information, the interface chip supplies in common the bank address signal and a chip selection signal to the core chips at the row access time, the interface chip supplies in common the bank address signal to the core chips at the column access time, out of the core chips, a core chip of which the chip selection signal supplied at the row access time matches the chip identification information performs a row access to a memory bank assigned by the bank address signal and holds activation information showing the memory bank, and out of the core chips, a core chip of which a memory bank shown by the bank address signal that is supplied at the column access time matches a memory bank shown by the activation information performs a column access to a memory bank assigned by the bank address signal.

In still another embodiment, there is provided an information processing system comprising: a semiconductor device having a plurality of core chips each including a plurality of memory banks selectively activated based on bank address signals and being allocated with mutually different chip identification information and has an interface chip that controls the core chips; and a controller that controls the semiconductor device, wherein the controller supplies to the interface chip first address information including the bank address signal and a chip selection signal to be compared with the chip identification information at a row access time, the controller supplies second address information including the bank address signal to the interface chip at a column access time, the interface chip supplies in common the first address information to the core chips at the row access time, the interface chip supplies in common the second address information to the core chips at the column access time, out of the core chips, a core chip of which the chip selection signal supplied at the row access time matches the chip identification information performs a row access to a memory bank assigned by the bank address signal and holds activation information showing the memory bank, and out of the core chips, a core chip of which a memory bank shown by the bank address signal that is supplied at the column access time matches a memory bank shown by the activation information performs a column access to a memory bank assigned by the bank address signal.

According to the present invention, each semiconductor chip holds activation information in each memory bank. Therefore, even when a chip selection signal is not supplied at a column access time, an invalid column access is not performed in a semiconductor chip other than a semiconductor chip to be accessed. Accordingly, the power consumption of the semiconductor chip can be reduced.

BRIEF DESCRIPTION OF THE DRAWINGS

The above features and advantages of the present invention will be more apparent from the following description of certain preferred embodiments taken in conjunction with the accompanying drawings, in which:

FIG. 6 is a table illustrating allocation of an address according to the I/O configuration;

FIGS. 13A and 13B are tables illustrating allocation of an address according to the I/O configuration, when the defective chip exists.

DETAILED DESCRIPTION OF THE EMBODIMENTS

Preferred embodiments of the present invention will be explained below in detail with reference to the accompanying drawings.

Figure 1:
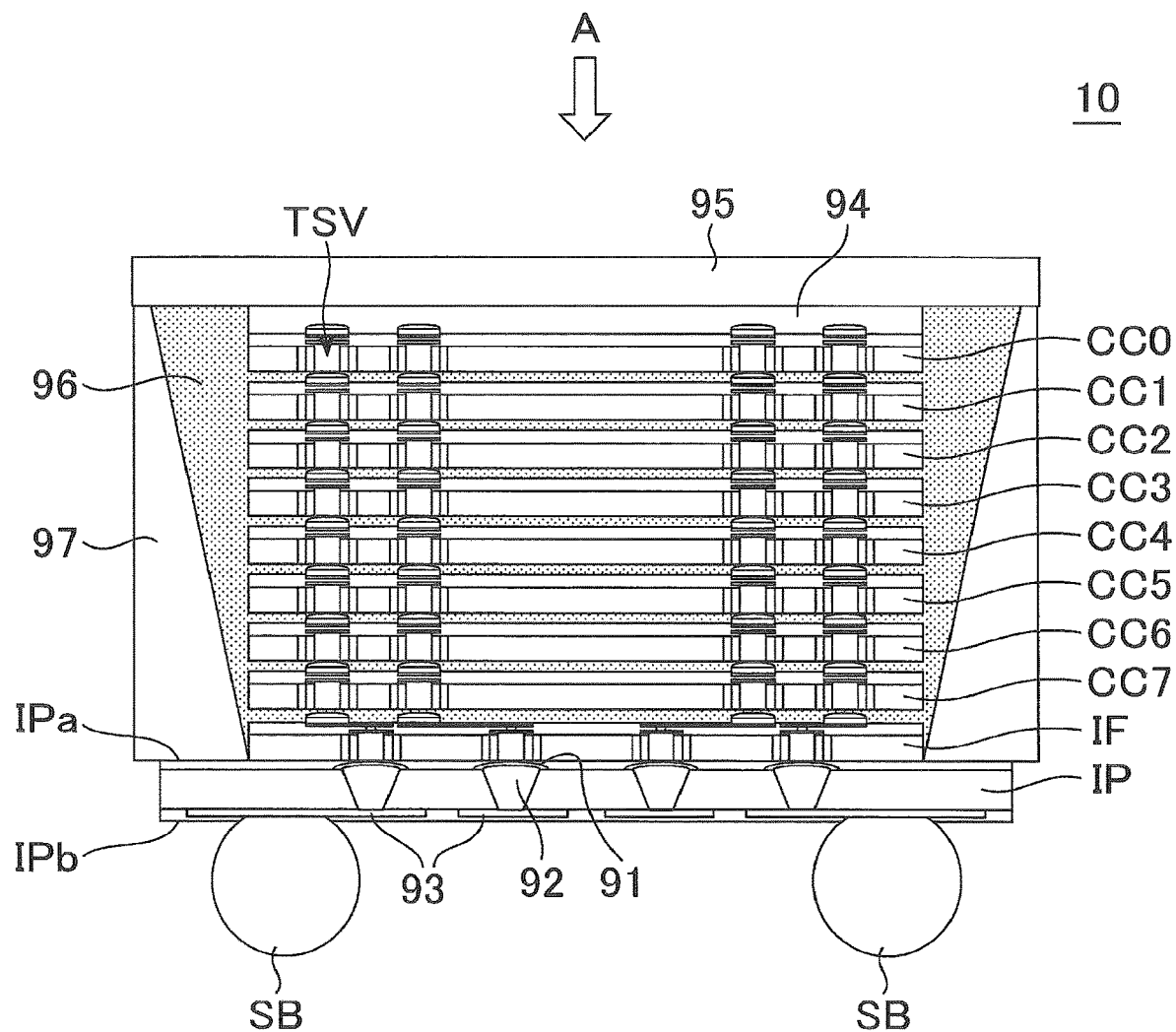
FIG. 1 is a schematic cross-sectional view illustrating the structure of a semiconductor device according to the preferred embodiment of the present invention.

FIG. 1 is a schematic cross-sectional view provided to explain the structure of a semiconductor device 10 according to the preferred embodiment of the present invention.

As shown in FIG. 1, the semiconductor device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. The interface chip IF has a front end function for communicating with the external device at a first operation frequency, and the plural core chips CC0 to CC7 have a back end function for communicating with only the interface chip IF at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
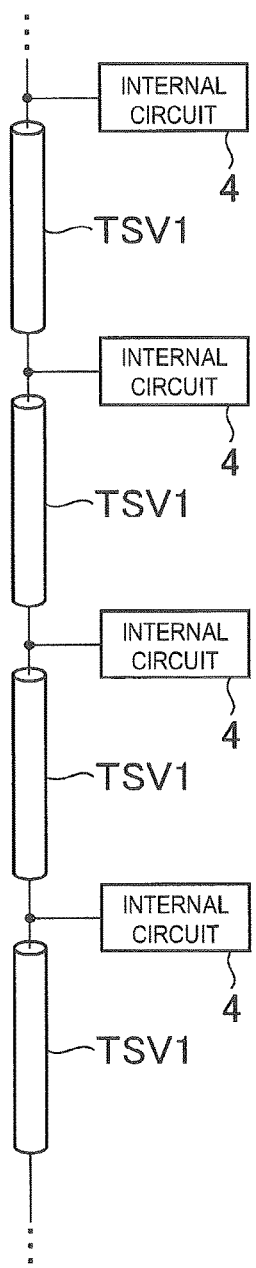
FIGS. 2A to 2C are diagram showing the various types of TSV provided in a core chip.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1 s that are provided at the same position in plain view are short-circuited, and one wiring line is configured by the TSV1. The TSV1 that are provided in the core chips CC0 to CC7 are connected to internal circuits in the core chips, respectively. Accordingly, input signals (command signal, address signal, etc.) that are supplied from the interface chip IF to the TSV1 s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Figure 2B:
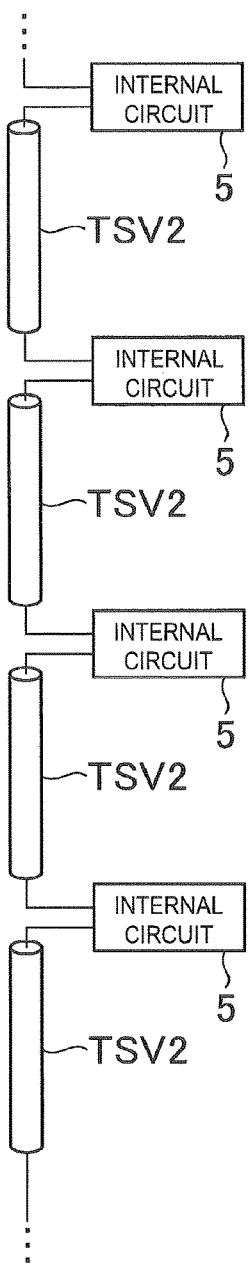

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits 5 that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Figure 2C:
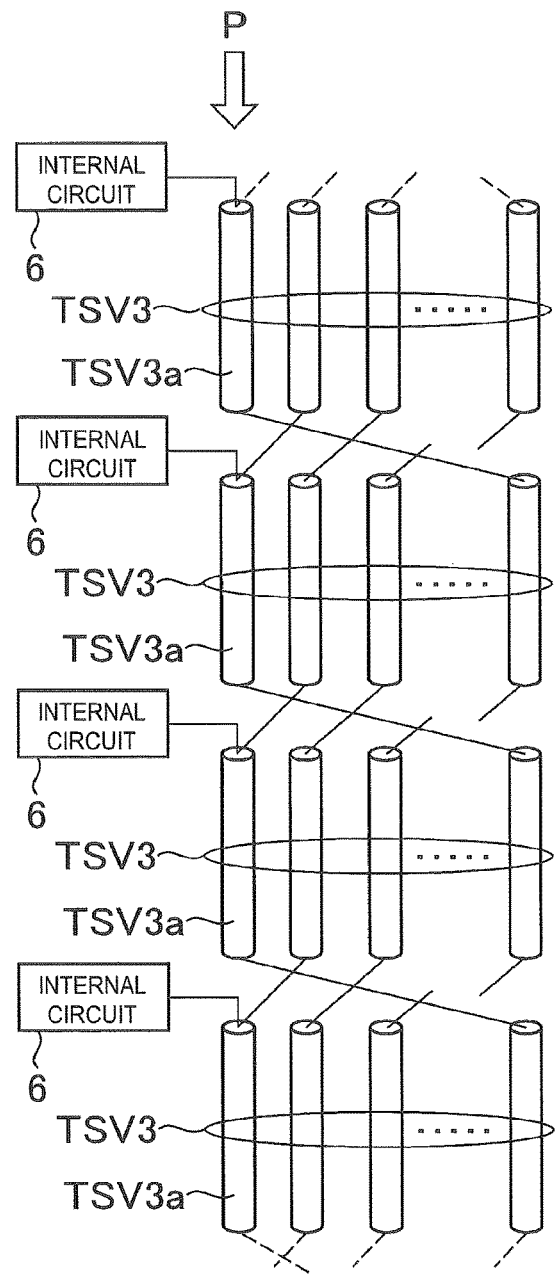

Another TSV group is short-circuited from the TSVs of other layer provided at the different position in plan view, as shown in FIG. 2C. With respect to this kind of TSV group 3, internal circuits 6 of the core chips CC0 to CC7 are connected to the TSV3 *a* provided at the predetermined position P in plain view. Thereby, information can be selectively input to the internal circuits 6 provided in the core chips. As this information, defective chip information to be described below is exemplified.

As such, as types of the TSVs provided in the core chips CC0 to CC7, three types (TSV1 to TSV3) shown in FIGS.

2A to 2C exist. As described above, most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
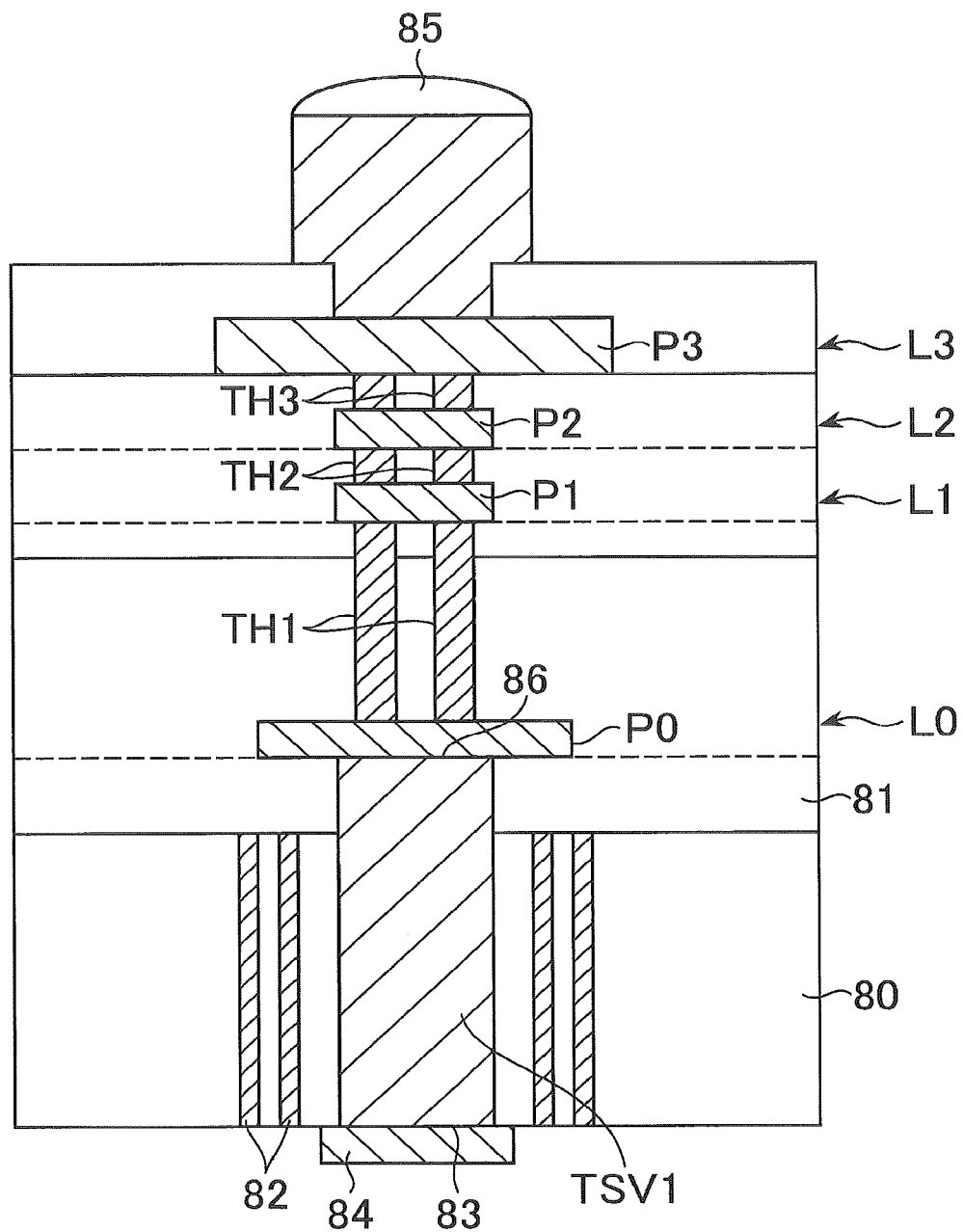
FIG. 3 is a cross-sectional view illustrating the structure of the TSV of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on a surface of the silicon substrate 80. Around the TSV1, an insulating ring 82 is provided. Thereby, the TSV1 and a transistor region are insulated from each other. In an example shown in FIG. 3, the insulating ring 82 is provided double. Thereby, capacitance between the TSV1 and the silicon substrate 80 is reduced.

An end 83 of the TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the TSV1, through plural pads P0 to P3 provided in wiring layers 11) to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
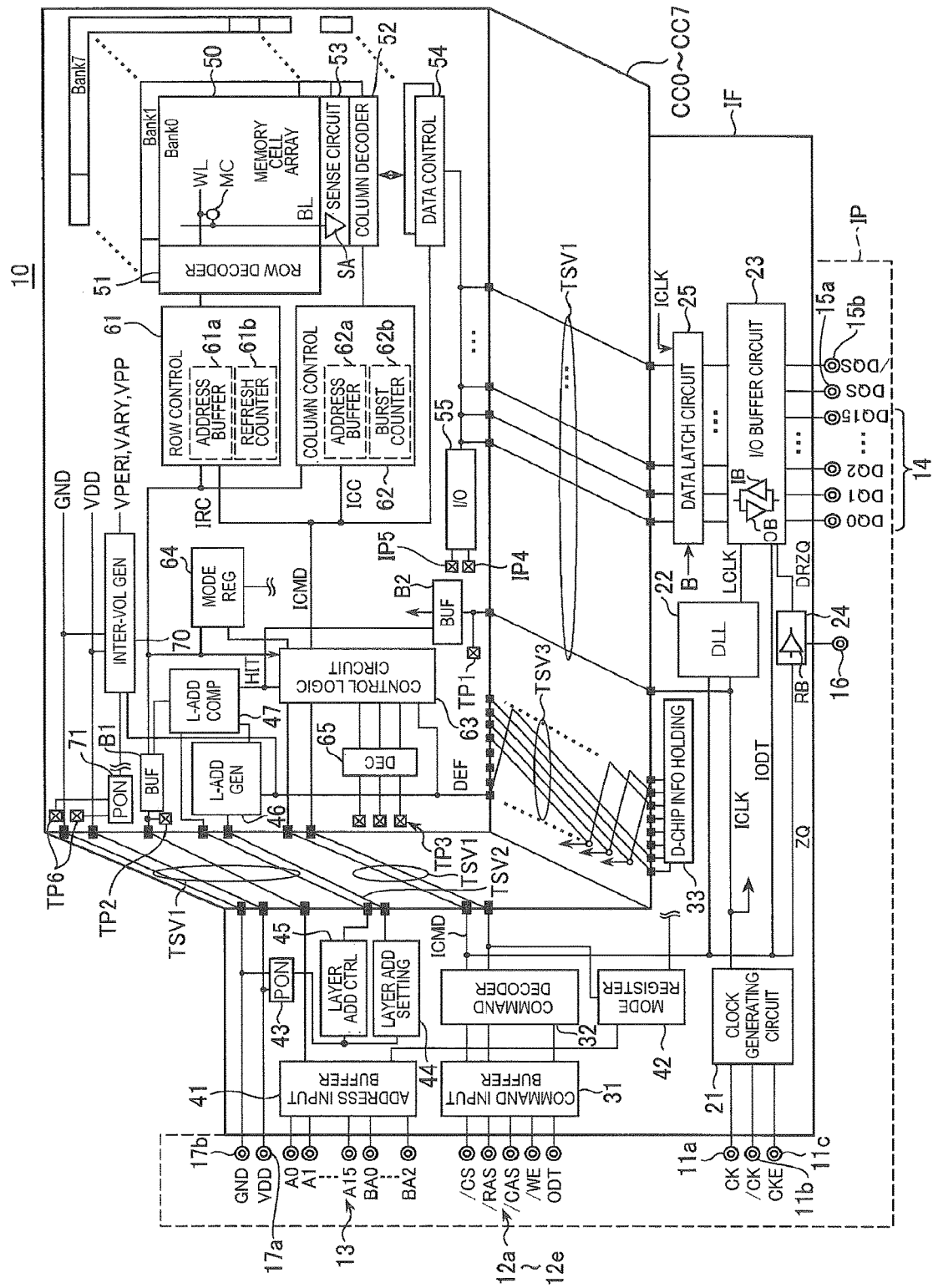
FIG. 4 is a block diagram illustrating the circuit configuration of the semiconductor memory device.

FIG. 4 is a block diagram illustrating the circuit configuration of the semiconductor memory device 10.

As shown in FIG. 4, the external terminals that are provided in the interposer IP include clock terminals 11 *a* and 11 *b*, an clock enable terminal 11 *c*, command terminals 12 *a* to 12 *e*, an address terminal 13, a data input/output terminal 14, data strobe terminals 15 *a* and 15 *b*, a calibration terminal 16, and power supply terminals 17 *a* and 17 *b*. All of the external terminals are connected to the interface chip IF and are not directly connected to the core chips CC0 to CC7, except for the power supply terminals 17 *a* and 17 *b*.

First, a connection relationship between the external terminals and the interface chip IF performing the front end function and the circuit configuration of the interface chip IF will be described.

The clock terminals 11 *a* and 11 *b* are supplied with external clock signals CK and /CK, respectively, and the clock enable terminal 11 *c* is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12 *a* to 12 *e* are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15*a* and 15 *b* are terminals that are used to input/output strobe signals DQS and /DQS. The data input/output terminal 14 and the data strobe terminals 15 *a* and 15 *b* are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/ output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, the number of bits of unit internal data simultaneously input/output between each of the core chips CC0 to CC7 and the interface chip IF is larger than the number of bits of unit external data simultaneously input/output between the interface chip IF and outside. That is, the data latch circuit 25 functions to convert serial unit external data into parallel unit internal data, and to convert parallel unit internal data into serial unit external data.

That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the TSVs. The defective chip information holding circuit 33 is connected to the core chips CC0 to CC7 while being shifted, using the TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described. The core chips CC0 to CC7 are chips on which a read operation or a write operation can be performed by performing a row access and a column access in this order.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the TSV, and the row address that is buffered by the address buffer 61a is supplied to the row decoder 51. The address signal that is supplied through the TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 receives an internal command ICMD supplied from the interface chip IF through the TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the TSV. As the defective chip signal DEF is supplied to the individual core chips CC0 to CC7 using the TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads includes a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 5:
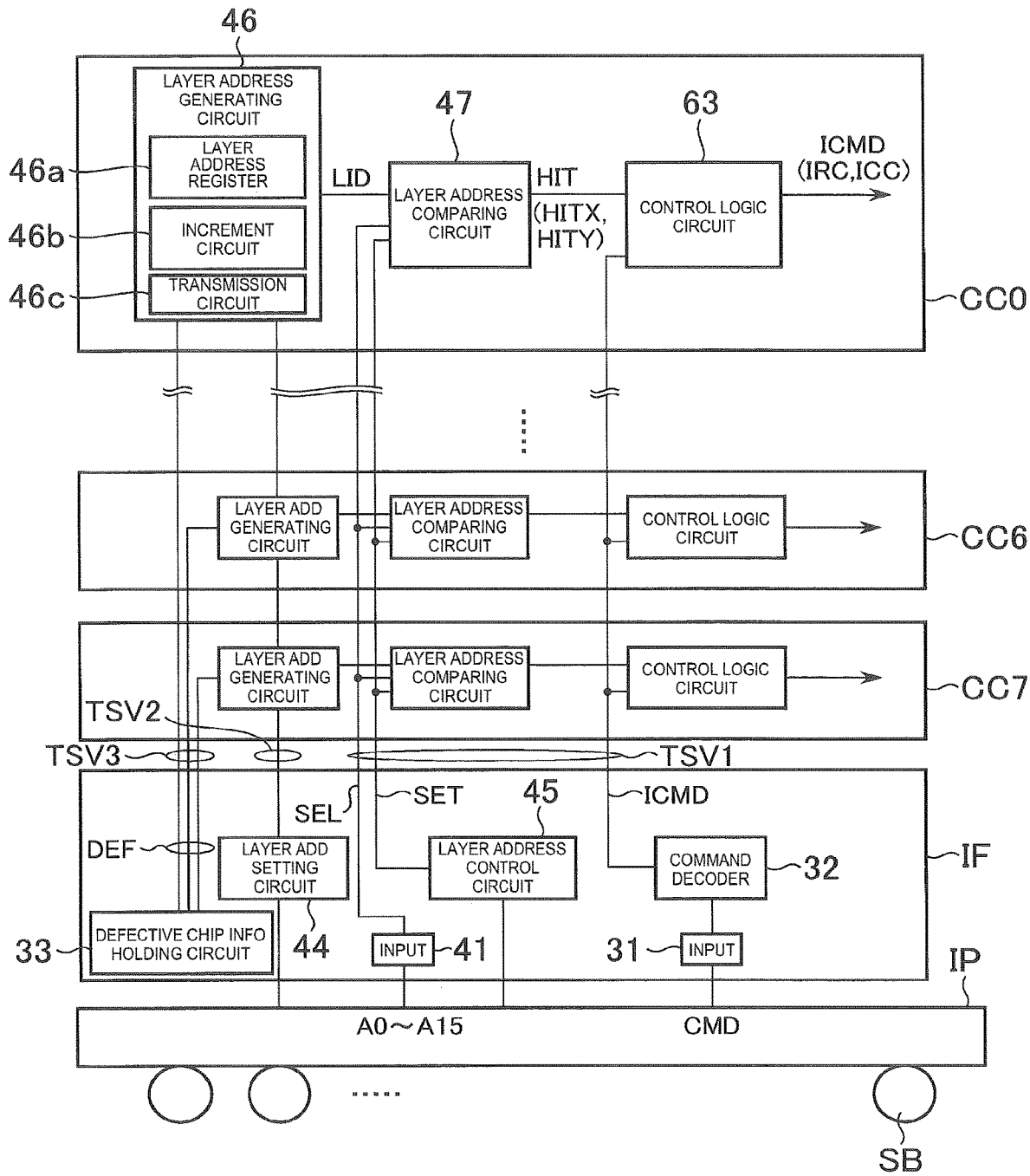
FIG. 5 is a diagram showing a circuit associated with selection of the core chips.

FIG. 5 is a diagram showing a circuit associated with selection of the core chips CC0 to CC7.

As shown in FIG. 5, the layer address generating circuits 46 are provided in the core chips CC0 to CC7, respectively, and are cascade-connected through the TSV2 of the type shown in FIG. 2B. The layer address generating circuit 46 includes a layer address register 46 *a*, an increment circuit 46 *b*, and a transmission circuit 46 *c*.

The layer address register 46 *a* holds a layer address (chip identification information) LID of 3 bits. When the power supply is detected by the power-on detecting circuit 71 shown in FIG. 4, a register value is initialized to a minimum value (0, 0, 0). In the core chip CC0 of the uppermost layer, the increment circuit 46 *b* increments an layer address LID (0, 0, 0) in the layer address register 46 *a* and the incremented value (0, 0, 1) is transmitted to the core chip CC1 of the lower layer by the transmission circuit 46 *c*. A transmitted layer address LID (0, 0, 1) is set to the layer address register 46 *a* of the core chip CC1.

Even in the core chip CC1, a value (0, 1, 0) that is obtained by incrementing the layer address LID (0, 0, 1) in the layer address register 46 *a* by the increment circuit 46 *b* is transmitted to the core chip CC2 of the lower layer by the transmission circuit 46 *c*.

Hereinafter, in the same way as the above case, the incremented layer addresses LID are sequentially transmitted to the core chips of the lower layers. Finally, a maximum value (1, 1, 1) is set to the layer address register 46 *a* of the core chip CC7 of the lowermost layer. Thereby, each of the core chips CC0 to CC7 has a unique layer address LID.

A defective chip signal DEF is supplied from the defective chip information holding circuit 33 of the interface chip IF to the layer address generating circuit 46 through the TSV3 of the type shown in FIG. 2C. The defective chip signal DEF is a signal of 8 bits and the bits are supplied to the corresponding core chips CC0 to CC7. The core chip where the corresponding bits of the defective chip signal DEF is activated is the defective chip. In the core chip where the corresponding bits of the defective chip signal DEF is activated, the transmission circuit 46 *c* transmits, to the core chip of the lower layer, a non-incremented layer address LID, not an incremented layer address LID. In other words, the LID allocating of defective chip is skipped. That is, the layer address LID that is allocated to each of the core chips CC0 to CC7 is not fixed and changes according to the defective chip signal DEF. The same layer address LID as the lower layer is allocated to the defective chip. However, since the control logic circuit 63 is prohibited from being activated in the defective chip, a read operation or a write operation is not securely performed, even though an address signal or a command signal is input from the interface chip IF.

The layer address LID is further supplied to the layer address comparing circuit (chip information comparing circuit) 47 in each of the core chips CC0 to CC7. The layer address comparing circuit 47 compares the layer address LID (chip identification information) supplied from the layer address generating circuit 46 and a portion of the address signal (chip selection information SEL) supplied from the interface chip IF through the TSV. As the address signal is commonly supplied to the core chips CC0 to CC7 through the TSV1 of the type shown in FIG. 2A, the core chip where matching is detected as a comparison result by the layer address comparing circuit 47 is only one.

The address signal supplied form the interface chip IF includes a row address and a column address, and the row address and the column address are supplied to the core chips CC0 to CC7 in order of the row address and the column address. Accordingly, when the all of chip selection information SEL is included in the row address, the comparison operation is completed when the row address is input. Meanwhile, when a portion of the chip selection information SEL is included in the row address and a remaining portion of the chip selection information SEL is included in the column address, the comparison operation is not completed when the row address is input and is completed when the column address is input.

A portion of the address signal that is used as the chip selection information SEL depends on the I/O configuration. That is, the chip selection information SEL is not fixed and changes according to the I/O configuration. In this case, the I/O configuration indicates the configuration of the number of bits of external unit data that is simultaneously input and output between the semiconductor memory device and the external device. In this embodiment, the 16-bit configuration (DQ0 to DQ15), the 8-bit configuration (DQ0 to DQ7), and the 4-bit configuration (DQ0 to DQ3) can be selected. The I/O configuration can be selected by fuse cutting or a bonding option.

FIG. 6 is a table illustrating allocation of an address according to the I/O configuration.

As shown in FIG. 6, when the 16-bit configuration (16DQ) is selected, bits A0 to A15 of an address signal are used as row addresses X0 to X15 and the bits A0 to A9 are used as column addresses Y0 to Y9. Among them, the row addresses X13 to X15 are used as the chip selection information SEL. Accordingly, when the 16-bit configuration (16DQ) is selected, the chip selection information SEL is fixed at inputting the row address.

When the 8-bit configuration (8DQ) is selected, the bits A0 to A15 of the address signal are used as the row addresses X0 to X15 and the bits A0 to A9 and A11 are used as the column addresses Y0 to Y9 and Y11. Among them, the row addresses X14 and X15 and the column address Y11 are used as the chip selection information SEL. When the 4-bit configuration (4DQ) is selected, the bits A0 to A15 of the address signal are used as the row addresses X0 to X15 and the bits A0 to A9, A11, and A13 are used as the column addresses Y0 to Y9, Y11, and Y13. Among them, the row addresses X14 and X15 and the column address Y13 are used as the chip selection information SEL. Accordingly, when the 8-bit configuration (8DQ) or the 4-bit configuration (4DQ), the chip selection information SEL is not fixed before both the row address and the column address are input.

Referring back to FIG. 5, the layer address control circuit 45 uses a designation signal SET to designate a portion of the address signal used as the chip selection information SEL, according to the selected I/O configuration. The designation signal SET is commonly supplied to the layer address comparing circuits 47 of the core chips CC0 to CC7 through the TSVs. The layer address comparing circuit 47 compares the layer address LID supplied from the layer address generating circuit 46 and the chip selection information SEL supplied from the interface chip IF and activates a matching signal HIT, when the layer address LID and the chip selection information SEL are matched with each other. The matching signal HIT is supplied to the control logic circuit 63 in the corresponding core chip. The control logic circuit 63 is activated by the matching signal HIT and validates internal commands ICMD that are supplied from the interface chip IF through the TSV. Among the validated internal commands, an internal row command IRC is supplied to the row control circuit 61 shown in FIG. 1 and an internal column command ICC is supplied to the column control circuit 62 shown in FIG. 1. In case the matching signal HIT is not activated, the control logic circuit 63 invalidates the internal commands ICMD. Accordingly, the internal commands ICMD that are commonly supplied to the core chips CC0 to CC7 are validated in any one of the core chips CC0 to CC7.

Figure 7:
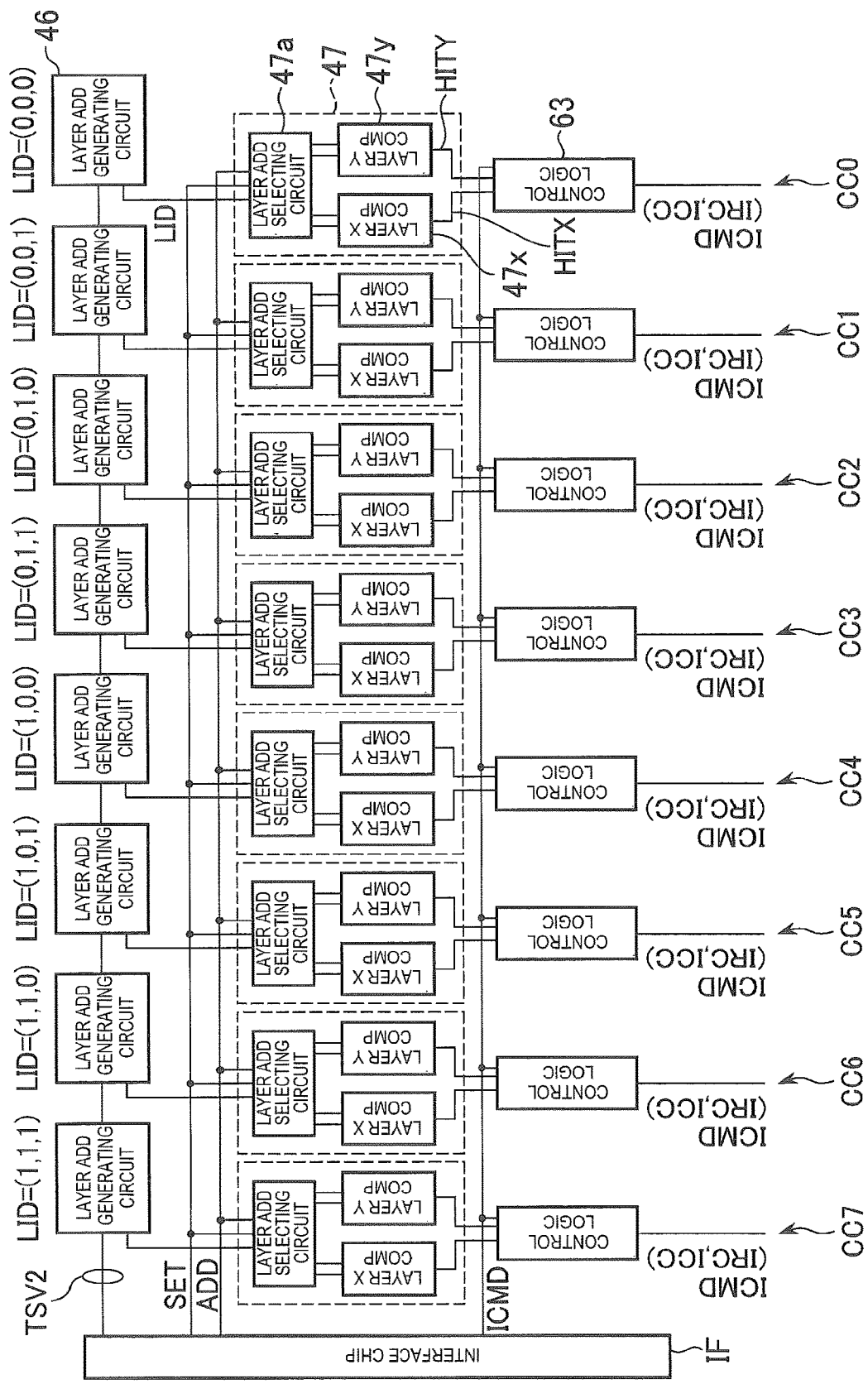
FIG. 7 is another example of a circuit associated with selection of the core chips, which specifically shows the configuration of the layer address comparing circuit.

FIG. 7 shows another example of a circuit associated with selection of the core chips CC0 to CC7, which specifically shows the configuration of the layer address comparing circuit 47.

As shown in FIG. 7, the layer address comparing circuit 47 includes a layer address selecting circuit 47 *a*, a row address comparing circuit 47 *x*, and a column address comparing circuit 47 *y*. The layer address selecting circuit 47 *a* receives the designation signal SET and selects a portion of an address signal ADD to be supplied to the row address comparing circuit 47 *x* and/or the column address comparing circuit 47 *y*. As described above, the designation signal SET is supplied from the layer address control circuit 45, on the basis of the I/O configuration.

The row address that is selected by the layer address selecting circuit 47 *a* is supplied to the row address comparing circuit 47 *x* together with the corresponding bits of the layer address LID. The row address comparing circuit 47 *x* compares the row address and the corresponding bits and activates a matching signal HITX, when the bits of the row address and the corresponding bits are perfectly matched with each other. Likewise, the column address that is selected by the layer address selecting circuit 47 *a* is supplied to the column address comparing circuit 47 *y* together with the corresponding bits of the layer address LID. The column address comparing circuit 47 *y* compares the column address and the corresponding bits and activates a matching signal HITY, when the bits of the column address and the corresponding bits are perfectly matched with each other. The matching signals HITX and HITY are supplied to the control logic circuit 63.

Figure 8:
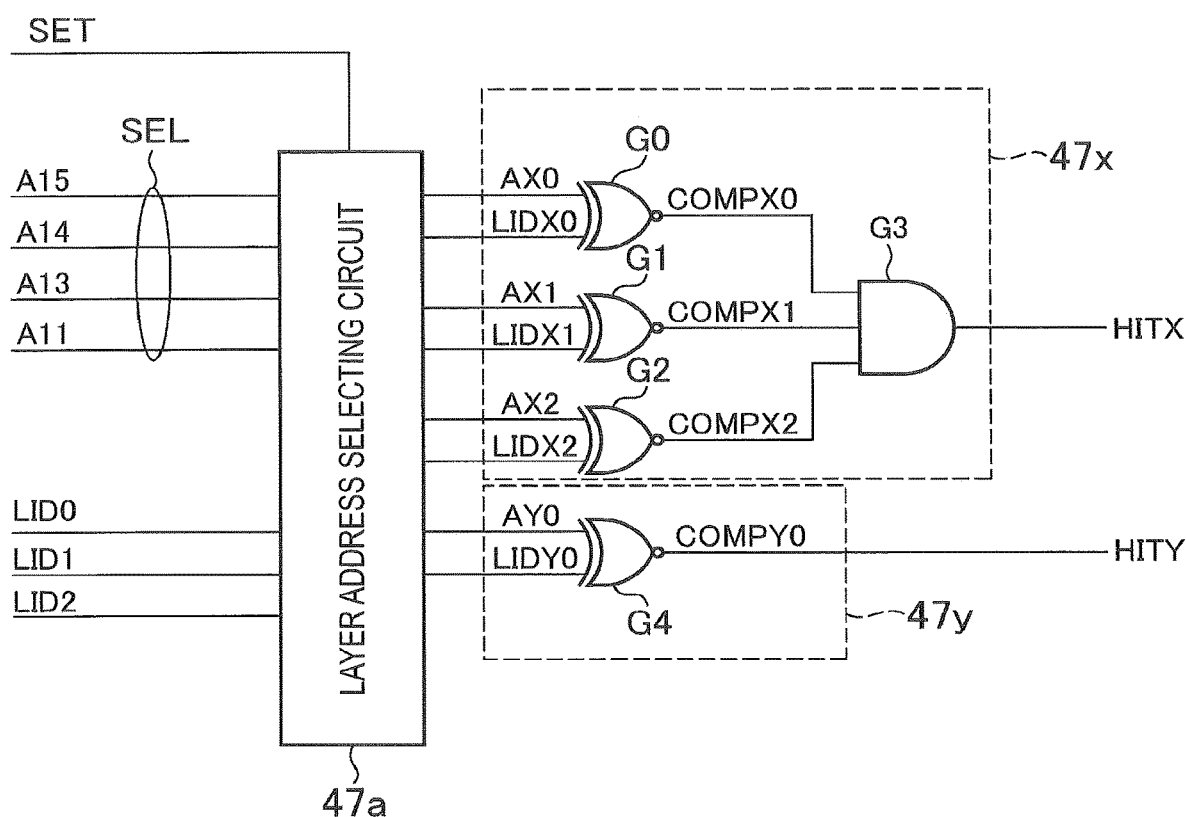
FIG. 8 is a circuit diagram of the layer address comparing circuit.

FIG. 8 is a circuit diagram of the layer address comparing circuit 47.

As shown in FIG. 8, the bits A11 and A13 to A15 of the address signal and the bits LID0 to LID2 of the layer address LID are supplied to the layer address selecting circuit 47 *a*, and the path for outputting these signals are switched by the designation signal SET.

Specifically, when the designation signal SET shows the 16-bit configuration (16DQ), the bits A13 to A15 of the address signal are output as output signals AX0 to AX2, respectively, and the bits LID0 to LID2 of the layer address LID are output as output signals LIDX0 to LIDX2, respectively. When the designation signal SET shows the 8-bit configuration (8DQ), the bits A14, A15, and A11 of the address signal are output as the output signals AX0, AX1, and AY0, respectively, and the bits LID0 to LID2 of the layer address LID are output as the output signals LIDX0, LIDX1, and LIDY0, respectively. When the designation signal SET shows the 4-bit configuration (4DQ), the bits A14, A15, and A13 of the address signal are output as the output signals AX0, AX1, and AY0, respectively, and the bits LID0 to LID2 of the layer address LID are output as the output signals LIDX0, LIDX1, and LIDY0, respectively.

Among the output signals that are selected in the above way, signals of a row address, that is, the signals AX0 to AX2 and LIDX0 to LIDX2 are supplied to the row address comparing circuit 47 *x*. The row address comparing circuit 47 *x* has ENOR gate circuits G0 to G2 that compare the corresponding bits of the output signals and an AND gate circuit G3 that receives output signals COMPX0 to COMPX2 of the ENOR gate circuits G0 to G2, and an output of the AND gate circuit G3 is used as the matching signal HITX.

Meanwhile, among the output signals from the layer address selecting circuit 47 *a*, the signals of the column address, that is, the signals AY0 and LIDY0 are supplied to the column address comparing circuit 47 *y* composed of an ENOR gate circuit G4. An output signal COMPY0 of the ENOR gate circuit G4 is used as the matching signal HITY.

When the designation signal SET shows the 16-bit configuration (16DQ), the output signals AY0 and LIDY0 of the layer address selecting circuit 47 *a* are fixed at the same logical level. Thereby, the matching signal HITY is maintained in an activated state. When the designation signal SET shows the 8-bit configuration (8DQ) or the 4-bit configuration (4DQ), the output signals AX2 and LIDX2 of the layer address selecting circuit 47 *a* are fixed at the same logical level. Thereby, the output signal COMPX2 is maintained in an activated state.

Figure 9:
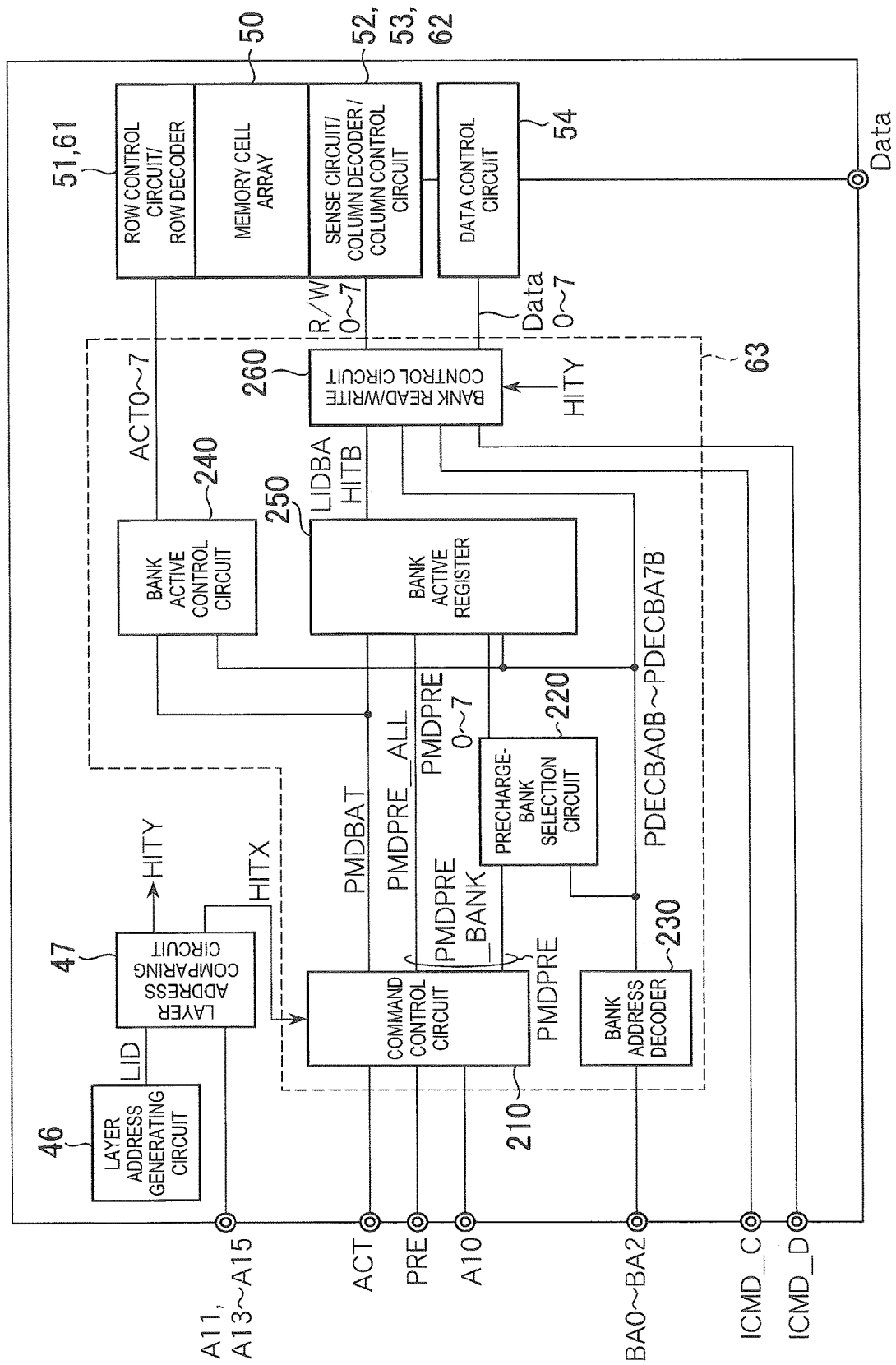
FIG. 9 is a block diagram showing a configuration of main parts of the core chip in more detail.

FIG. 9 is a block diagram showing a configuration of main parts of the core chip in more detail. FIG. 9 more specifically shows mainly elements of the control logic 63 directly relevant to the present invention.

As shown in FIG. 9, the control logic 63 includes a command control circuit 210. The command control circuit 210 receives an active command signal ACT, a precharge command signal PRE, a precharge assignment signal A10, and a hit signal HITX, and generates a row command signal PMDBAT and a precharge signal PMDPRE. The precharge signal PMDPRE includes an all-bank precharge signal PMDPRE_ALL that is activated at the time of precharging all banks, and a bank precharge signal PMDPRE_BANK that is activated at the time of precharging corresponding banks 0 to 7.

Detailed operations of the command control circuit 210 are as follows. That is, when the active command signal ACT is activated, the command control circuit 210 activates the row command signal PMDBAT based on a condition that the hit signal HITX is activated. When the precharge command signal PRE is activated, the command control circuit 210 activates the all-bank precharge signal PMDPRE_ALL when the precharge assignment signal A10 is at a high level, and activates the bank precharge signal PMDPRE_BANK when the precharge assignment signal A10 is at a low level.

The bank precharge signal PMDPRE_BANK is supplied to a precharge-bank selection circuit 220 in the control logic 63. The precharge-bank selection circuit 220 activates one of bank precharge signals PMDPRE_0 to PMDPRE_7 based on bank assignment signals PDECBA0B to PDECBA7B as outputs of a bank address decoder 230, when the bank precharge signal PMDPRE_BANK is activated.

The bank address decoder 230 receives three-bit bank address signals BA0 to BA2, and decodes these bank addresses. Therefore, only one bit of the bank assignment signals PDECBA0B to PDECBA7B as outputs of the bank address decoder 230 is activated based on the bank address signals BA0 to BA2.

As shown in FIG. 9, the control logic 63 includes a bank active control circuit 240. The bank active control circuit 240 receives the row command signal PMDBAT and the bank assignment signals PDECBA0B to PDECBA7B, and generates bank active signals ACT0 to ACT7. The bank active signals ACT0 to ACT7 correspond to the internal row command IRC shown in FIG. 4.

The bank active control circuit 240 activates any of the bank active signals ACT0 to ACT7 corresponding to the bank assignment signals PDECBA0B to PDECBA7B that are activated, in response to activation of the row command signal PMDBAT. As described above, the row command signal PMDBAT is generated when both the active command signal ACT and the hit signal HITX are activated. Therefore, the bank active control circuit 240 activates the bank active signals ACT0 to ACT7 assigned by the bank address signals BA0 to BA2, when chip selection information SEL that is supplied together with the active command signal ACT and the bank address signals BA0 to BA2 matches chip identification information LID. Consequently, a row access is performed to a bank which is assigned by the bank address signals BA0 to BA2, of the core chip assigned by the chip selection information SEL.

The control logic 63 further includes a bank active register 250. The bank active register 250 is a circuit that holds activation information of memory banks assigned by the bank address signals BA0 to BA2 when the chip selection information SEL that is supplied together with the active command signal ACT and the bank address signals BA0 to BA2 matches the chip identification information LID. While a circuit configuration of the bank active register 250 is described later, the bank active register 250 compares the activation information of the memory banks with the bank address signals BA0 to BA2 that are supplied together with the column command signal, and activates a hit signal LIDBAHITB when the activation information matches the bank address signals.

The hit signal LIDBAHITB is supplied to a bank read/write control circuit 260 in the control logic 63. The bank read/write control circuit 260 receives the hit signal LIDBAHITB, bank assignment signals PDECBA0B to PDECBA7B, column commands ICMD_C and ICMD_D, and a hit signal HITY, and activates any of read/write control signals R/W0 to R/W7 and any of data control signals Data0 to Data7 based on the received signals. The read/write control signals R/W0 to R/W7 and the data control signals Data0 to Data7 correspond to the internal column command ICC shown in FIG. 4.

Detailed operations of the bank read/write control circuit 260 are as follows. When the hit signal LIDBAHITB is activated, the bank read/write control circuit 260 activates the read/write control signals R/W0 to R/W7 and the data control signals Data0 to Data7 corresponding to the bank assignment signals PDECBA0B to PDECBA7B, based on a condition that the hit signal HITY is activated. The read/write control signals R/W0 to R/W7 are supplied to a circuit block such as a column control circuit 62, and are used as a signal that defines a control timing of a column switch and the like. Meanwhile, the data control signals Data0 to Data7 are supplied to a circuit block such as a data control circuit 54, and are used as a signal that defines an output timing of read data and an input timing of write data.

Figure 10:
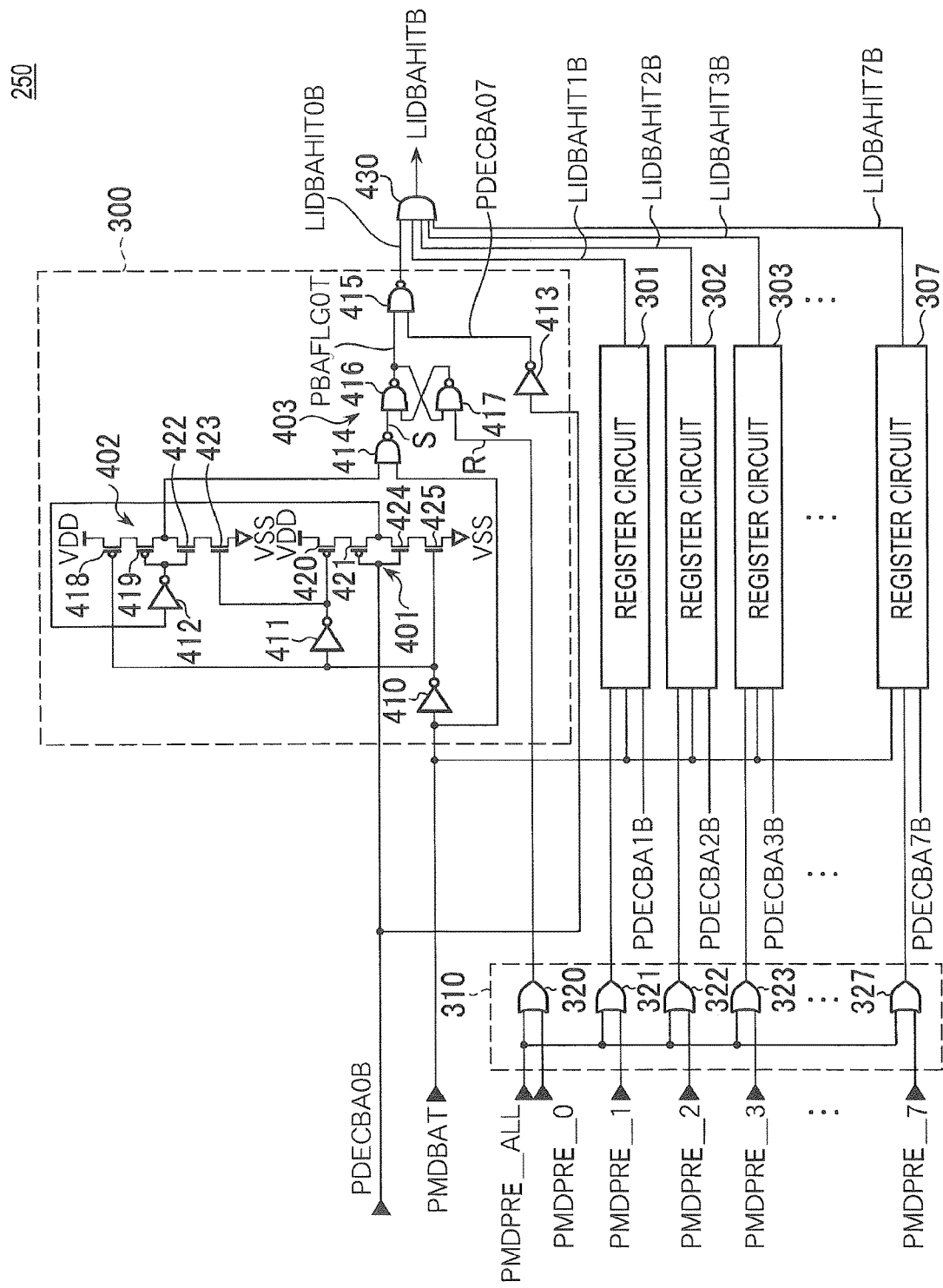
FIG. 10 is a circuit diagram of the bank active register.

FIG. 10 is a circuit diagram of the bank active register 250.

As shown in FIG. 10, the bank active register 250 includes register circuits 300 to 307 that are provided corresponding to the banks 0 to 7, respectively, and a reset control circuit 310 that resets these register circuits 300 to 307. Circuit configurations of the register circuits 300 to 307 are mutually the same, and therefore only a circuit configuration of the register circuit 300 is shown in FIG. 10.

The register circuit 300 includes tri-state inverters 401 and 402 that are connected in cascade, an SR latch circuit 403 that is set by an output of the tri-state inverter 402, and a NAND gate circuit 415 that compares a bank-active flag signal PBAFLGOT as an output of the SR latch circuit 403 with the bank assignment signal PDECBA0B.

The tri-state inverter 401 has a configuration that has transistors 420, 421, 424, and 425 connected in series between power sources VDD and VSS. Gates of the transistors 421 and 424 become input nodes. A corresponding bank assignment signal PDECBA0B is input to the input nodes. The row command signal PMDBAT is supplied to a gate of the transistor 420 via inverters 410 and 411. The row command signal PMDBAT is supplied to a gate of the transistor 425 via the inverter 410. An output of the tri-state inverter 401 is supplied to an input node of the tri-state inverter 402 via the inverter 412.

The tri-state inverter 402 has a configuration that has transistors 418, 419, 422, and 423 connected in series between the power sources VDD and VSS. Gates of the transistors 419 and 422 become input nodes. The row command signal PMDBAT is supplied to a gate of the transistor 418 via the inverter 410. The row command signal PMDBAT is supplied to a gate of the transistor 423 via the inverters 410 and 411. An output of the tri-state inverter 402 is supplied to one input node of a NAND gate circuit 414. The row command signal PMDBAT is supplied to the other input node of the NAND gate circuit 414. An output of the NAND gate circuit 414 is supplied to a set terminal S of the SR latch circuit 403 consisting of NAND gate circuits 416 and 417.

With the configuration described above, when the bank assignment signal PDECBA0B is activated at a low level, the SR latch circuit 403 is set in response to a rising edge of the row command signal PMDBAT, and a bank active flag signal PBAFLGOT as an output of the SR latch circuit 403 becomes at a high level. The bank active flag signal PBAFLGOT is supplied to one input node of the NAND gate circuit 415. The bank assignment signal PDECBA0B is supplied to the other input node of the NAND gate circuit 415 via the inverter 413.

Therefore, when the bank assignment signal PDECBA0B is activated at a low level again in a state that the SR latch circuit 403 is set, a bank hit signal LIDBAHIT0B as an output of the NAND gate circuit 415 is activated at a low level. As shown in FIG. 10, bank hit signals LIDBAHIT0B to LIDBAHIT7B that are output from the register circuits 300 to 307, respectively are input to the AND gate circuit 430, and an output of the AND gate circuit 430 is used as the hit signal LIDBAHITB. Therefore, when any of the bank hit signals LIDBAHIT0B to LIDBAHIT7B is activated at a low level, the hit signal LIDBAHITB is also activated at a low level.

The SR latch circuit 403 is set at a starting edge of the row command signal PMDBAT. Therefore, the SR latch circuit 403 corresponding to an assigned bank of the core chip that is assigned at a row access time is set. That is, when the chip selection information SEL that is supplied together with the active command signal ACT and the bank address signals BA0 to BA2 matches the chip identification information LID, the SR latch circuits 403 assigned by the bank address signals BA0 to BA2 are set.

When the same bank is assigned again at a column access time, the bank assignment signals PDECBA0B to PDECBA7B are activated at a low level again, and the hit signal LIDBAHITB is activated. Therefore, even when the SR latch circuit 403 included in any of the register circuits 300 to 307 is set by a row access, the hit signal LIDBAHITB is not activated when a different bank is assigned at the column access time. The hit signal LIDBAHITB is activated only when the SR latch circuit 403 included in any of the register circuits 300 to 307 is set by a row access and also when the same bank is assigned at a column access time thereafter.

On the other hand, a reset terminal R of the SR latch circuit 403 is connected to the reset control circuit 310. The reset control circuit 310 is configured by eight OR gate circuits 320 to 327 that correspond to the register circuits 300 to 307, respectively. The bank precharge signals PMDPRE_0 to PMDPRE_7 that correspond to the OR gate circuits 320 to 327 are supplied to input nodes at one side of these OR gate circuits, and the all-bank precharge signal PMDPRE_ALL is supplied to input nodes of the other side.

With this arrangement, when any of the bank precharge signals PMDPRE)_0 to PMDPRE_7 is activated, only the SR latch circuit 403 in a corresponding one of the register circuits 300 to 307 is selectively reset. On the other hand, when the all-bank precharge signal PMDPRE_ALL is activated, the SR latch circuits 403 in all the register circuits 300 to 307 are reset.

Figure 11:
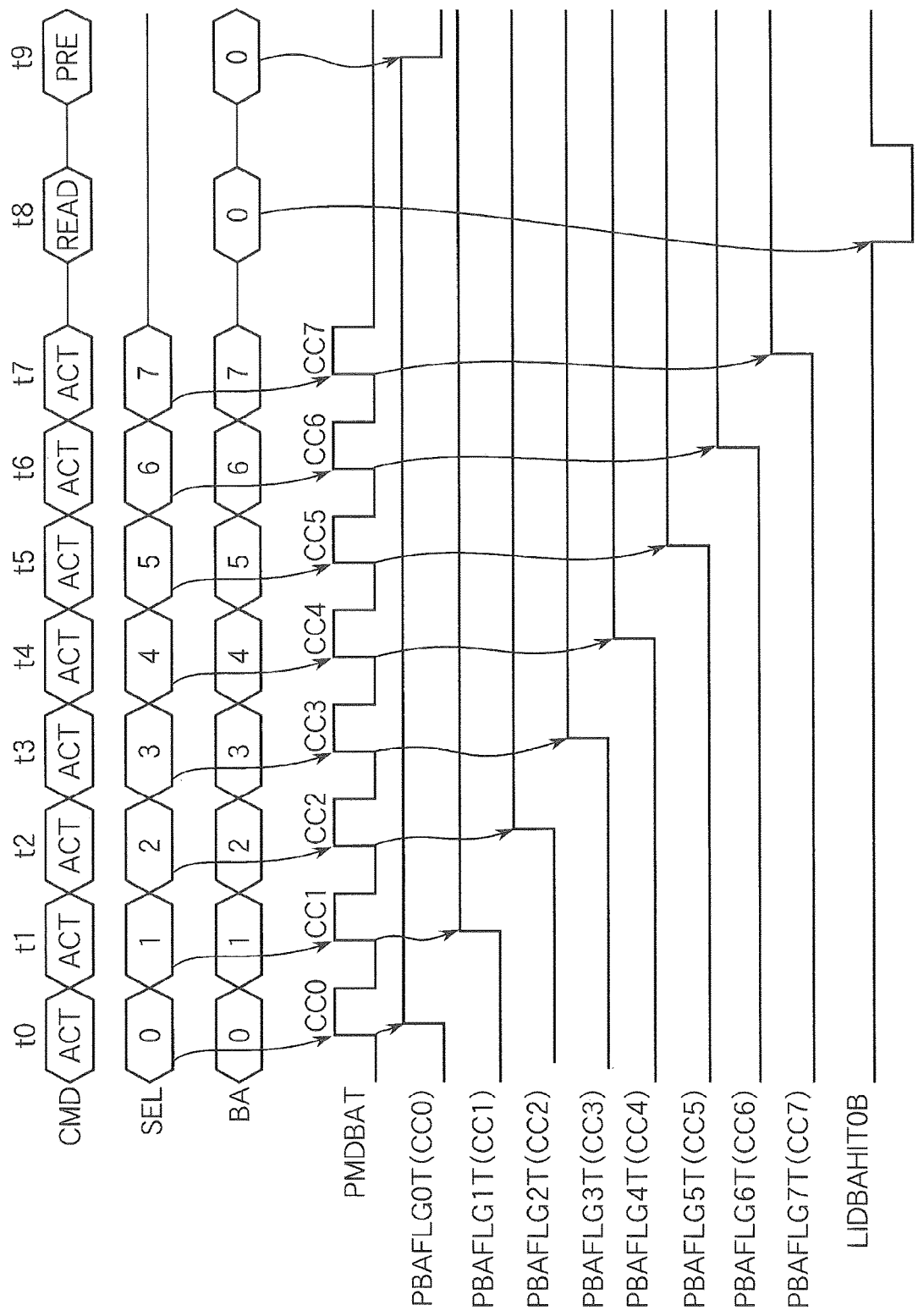
FIG. 11 is a timing diagram for explaining an operation of the control logic.

FIG. 11 is a timing diagram for explaining an operation of the control logic 63. In an example shown in FIG. 11, an assignment signal SET assigns a 16-bit configuration (16DQ). Therefore, bits A13 to A15 of an address signal are used as chip selection information SEL. That is, FIG. 11 shows an example that the chip selection information SEL is fixed at a row access time, and the chip selection information SEL is not supplied at a column access time.

In the example shown in FIG. 11, the active command signal ACT is issued from outside at times t0 to t7. Values of the chip selection information SEL that are supplied at the times t0 to t7 are "0" to "7", respectively. Values of the bank address signals BA0 to BA2 that are supplied at the times t0 to t7 are "0" to "7", respectively. Therefore, for example, a row access that assigns a bank 0 of a core chip CC0 is performed at the time t0, and a row access that assigns a bank 1 of a core chip CC1 is performed at the time t1.

Figure 12:
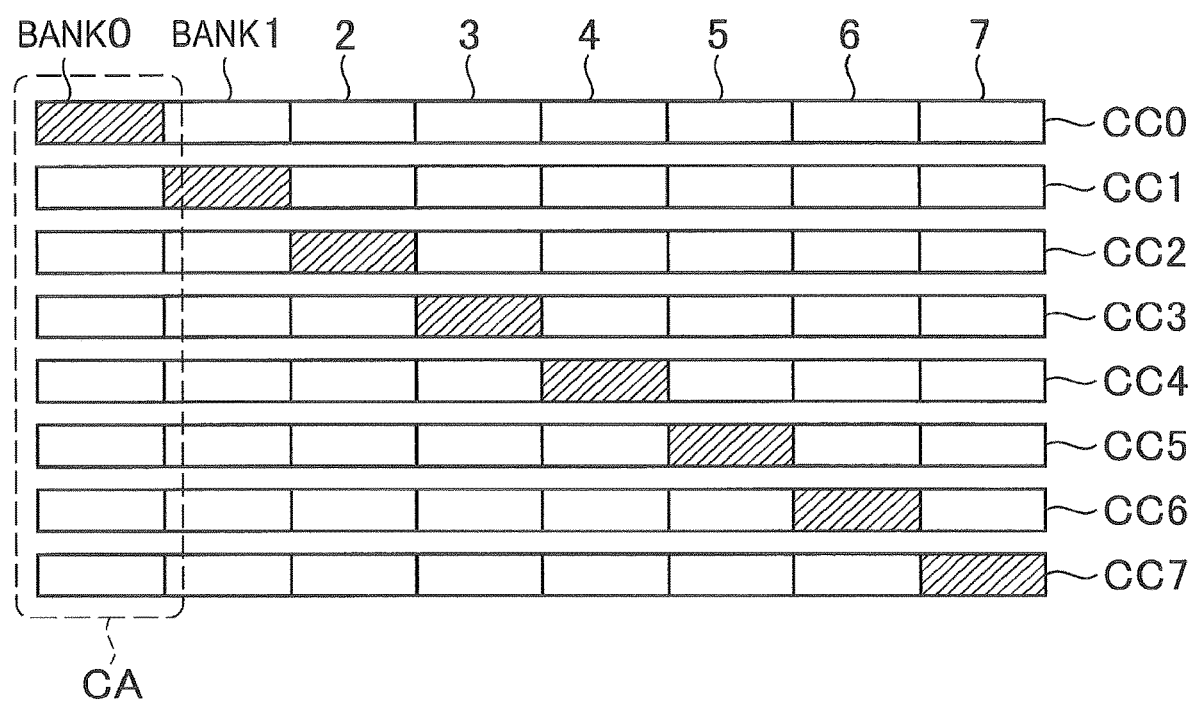
FIG. 12 is a schematic diagram for explaining which one of the register circuits.

In response thereto, the row command signal PMDBAT is activated in the corresponding core chips CC0 to CC7, respectively. Accordingly, the corresponding register circuits 300 to 307 are sequentially set in the core chips CC0 to CC7. For example, the register circuit 300 of the core chip CC0 is set at the time t0, and the register circuit 301 of the core chip CC is set at the time t1. FIG. 12 is a schematic diagram for explaining which one of the register circuits 300 to 307 of which core chip is set, and FIG. 12 shows a state that a hatched portion is set.

In the example shown in FIG. 11, a read command READ is issued from outside at a time t8. Values of the bank address signals BA0 to BA2 that are supplied at the time t8 are "0". In the present example, because the chip selection information SEL is not supplied at a column access time, it is not possible to determine which chip is assigned by an access from an address signal that is supplied at the column access time. It is clear that an area CA shown in FIG. 12 is an area assigned by a column address which is supplied at the time t8 and that a core chip is not assigned.

However, only the core chip CC0 is a core chip in which the register circuit 300 corresponding to the bank 0 is set at the time t8. Therefore, the hit signal LIDBAHITB is activated in only the core chip CC0. Consequently, a column access (a read operation) is selectively performed to the bank 0 of the core chip CC0. That is, although a column address does not include information that assigns a core chip, a column access is selectively performed to the core chip CC0 and a column access is not performed to other core chips CC1 to CC7.

The precharge command signal PRE is issued from outside at a time t9. Although not shown in FIG. 11, the precharge assignment signal A10 at the time of issuing the precharge command signal PRE is at a low level, and values of the bank address signals BA0 to BA2 are "0". Consequently, the register circuits 300 of the core chips CC0 to CC7 are selectively reset.

As explained above, in the present embodiment, because activation information of a bank assigned in a core chip that is assigned at a row access time is held in the bank active register 250, only the bank in the core chip to be accessed can be selectively activated even when an address that is supplied at a column access time does not include the chip selection information SEL.

As explained above, activation information by a row access is not held in a unit of a bank in each core chip, and can be also held in a unit of a core chip like in the present embodiment. This method does not generate a problem on an access for the following reasons. In a core chip in which chip activation information is in an active state, a column access is received regardless of a bank address signal, but a column access to a memory bank which is not in an active state becomes invalid. Consequently, damaging of data or conflict of data does not occur. However, this invalid column access increases power consumption. On the other hand, when activation information by a row access is held in a unit of a bank for each core chip like in the present embodiment, an invalid column access as described above is not performed, and wasteful power consumption can be reduced.

According to the semiconductor memory device 10 of the present embodiment, a part of an address signal for specifying a memory cell is used as the chip selection signal SEL. Therefore, the semiconductor memory device 10 does not require a special signal for performing a chip selection. That is, the controller recognizes this semiconductor memory device as a single DRAM that has a memory capacity 8 GB. Because an interface of the semiconductor memory device is the same as that of a conventional DRAM, compatibility with the conventional DRAM can be secured.

Furthermore, because which bit of an address signal is to be used as the chip selection information SEL is selected corresponding to an I/O configuration, a complex control such as a changing of a page configuration based on an I/O number becomes unnecessary. That is, as shown in FIG. 6, when a 16-bit configuration (=16DQ) is selected, bits that are used as row addresses in the core chip are X0 to X12, and all remaining bits X13 to X15 can be allocated to the chip selection information SEL. On the other hand, when an eight-bit configuration (=8DQ) or a four-bit configuration (=4DQ) is selected, the bit X13 is also used as a row address in the core chip. Therefore, when the chip selection information SEL is allocated in a similar manner to that of a 16-bit configuration, a process of changing over a page size from 1 KB to 2 KB becomes necessary. On the other hand, according to the semiconductor memory device 10 of the present embodiment, this changeover is not necessary, and a circuit configuration can be simplified.

In the semiconductor memory device 10 according to this embodiment, because the defective chip is skipped in the allocation of the layer address LID, the controller recognizes that there is no defective chip. Therefore, even when the defective chip is discovered after an assembly, only the valid partial core chips can be operated without requesting the controller to perform the special control.

When the defective chip is discovered after the assembly, it is preferable to set a valid core chip number as power-of-two by invalidating the normal chips according to necessity.

Specifically, when the defective chip number is 1 to 4, the valid core chip number may be set as 4, when the defective chip number is 5 and 6, the valid core chip number may be set as 2, and when the defective chip number is 7, the valid core chip number may be set as 1. According to this configuration, since an address space becomes power-of-two, control of the controller is facilitated.

FIGS. 13A and 13B are tables illustrating allocation of an address according to the I/O configuration, when the defective chip exists. FIG. 13A shows the case where the valid core chip number is 4 (=4 GB) and FIG. 13B shows the case where the valid core chip number is 2 (2 GB).

As shown in FIG. 13A, in the case of the 4 GB configuration using the four core chips, the row address X15 in the 16-bit configuration (16DQ), the column address Y11 in the 8-bit configuration (8DQ), and the column address Y13 in the 4-bit configuration (4DQ) are not used, as compared with the address configuration shown in FIG. 6. In regards to the chip selection information SEL, the same bits as the example shown in FIG. 6 are used, except that the bit configuration becomes the 2-bit configuration and the most significant bit SEL2 is not used.

As shown in FIG. 13B, in the case of the 2 GB configuration using the two core chips, the row addresses X14 and X15 in the 16-bit configuration (16DQ), the row address X15 and the column address Y11 in the 8-bit configuration (8DQ), and the row address X15 and the column address Y13 in the 4-bit configuration (4DQ) are not used, as compared with the address configuration shown in FIG. 6. In regards to the chip selection information SEL, the same bits as the example shown in FIG. 6 are used, except that the bit configuration becomes the 1-bit configuration and the upper 2 bits SEL2 and SEL1 are not used.

As such, even when some core chips are not used, the circuit configuration of the layer address comparing circuit 47 does not need to be changed.

Figure 14:
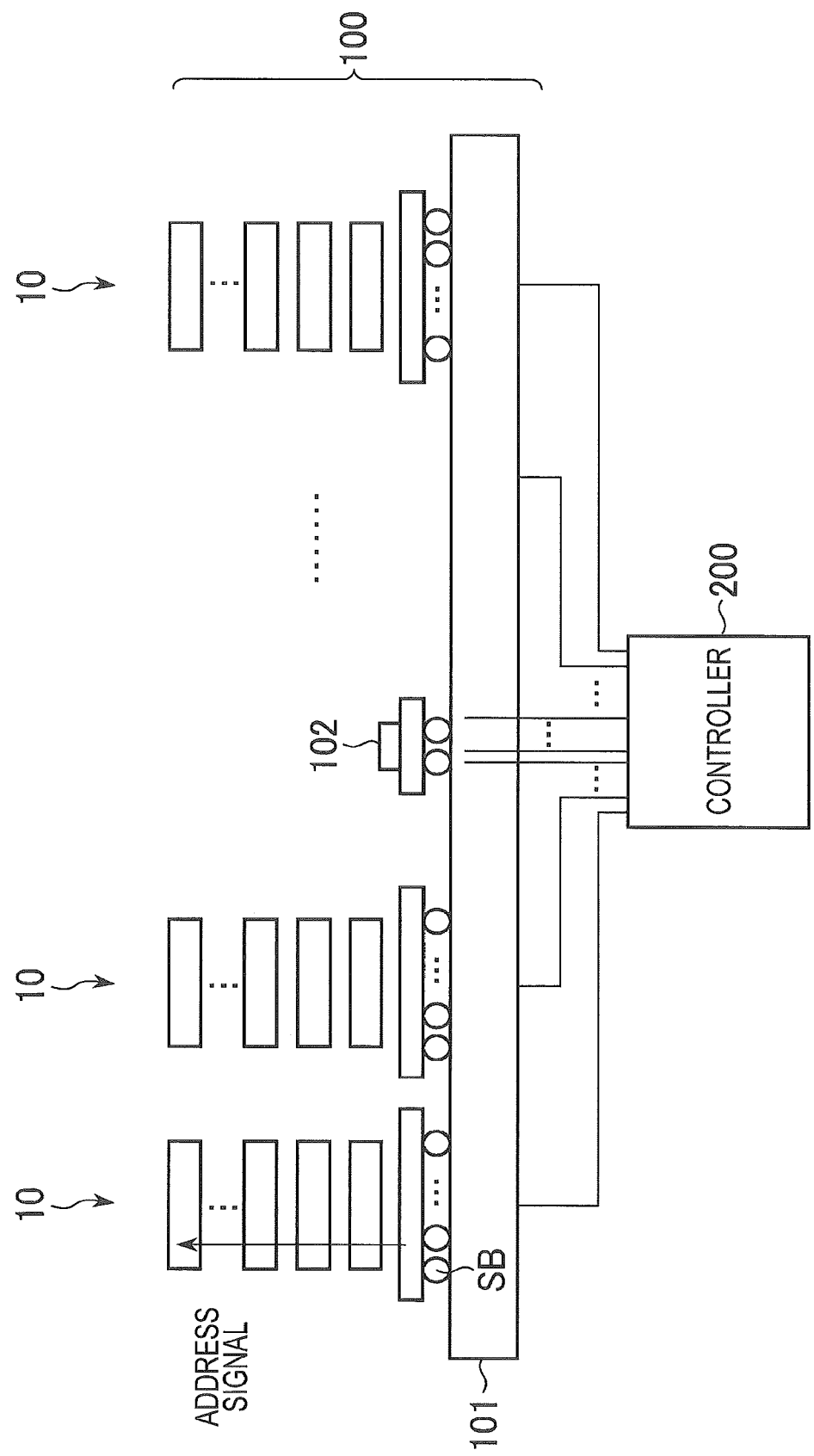
FIG. 14 is a diagram showing the configuration of a data processing system using the semiconductor memory device according to this embodiment.

FIG. 14 is a diagram showing the configuration of a data processing system using the semiconductor memory device 10 according to this embodiment.

The data processing system shown in FIG. 14 includes a memory module 100 and a controller 200 connected to the memory module 100. In the memory module 100, the plural semiconductor memory devices 10 are mounted on a module substrate 101. A register 102 that receives an address signal or a command signal supplied from the controller 200 is mounted on the module substrate 101, and the address signal or the command signal is supplied to each semiconductor memory device 10 through the register 102. The controller 200 supplies row address information including the bank address signals BA0 to BA2 and the chip selection information SEL to the memory module 100 at a row access time, and supplies column address information including the bank address signals BA0 to BA2 to the memory module 100 at a column access time.

In the data processing system that has the above configuration, the controller 200 may supply only various signals, such as the address signals or the command signals, which are needed for an access of a common DRAM, and does not need to supply a special signal, such as a chip selection address, which is not used in the common DRAM.

It is apparent that the present invention is not limited to the above embodiments, but may be modified and changed without departing from the scope and spirit of the invention.

For example, in the above described embodiment, the DDR3-type SDRAM is used as the core chip, but the present invention is not limited thereto. Accordingly, the core chip may be a DRAM other than the DDR3-type and may be a semiconductor memory (SRAM, PRAM, MRAM or flash memory) other than the DRAM. All of the core chips do not need to be laminated and all or part of the core chips may be two-dimensionally disposed. The number of core chips is not restricted to 8.

What is claimed is:

1. A controller for a stacked dynamic random access memory (DRAM) device, the stacked DRAM device having a plurality of DRAM chips;
   wherein the controller is configured to provide bank selection information to the stacked DRAM device by:
      transmitting an external command to the stacked DRAM device, the external command including a row address strobe signal, a column address strobe signal, a write enable signal, and a chip select signal; and
      transmitting an external address to the stacked DRAM device, the external address including a plurality of chip selection address bits, a plurality of row or column address bits, and a plurality of bank selection address bits;
   wherein the bank selection information:
      indicates that a bank identified by the plurality of bank selection address bits is to be activated in a selected DRAM chip identified by the plurality of chip selection address bits; and
      causes the selected DRAM chip to store an indication of the bank selection information in a register in response to the indication being received concurrently with activation information corresponding to the bank selection information.

2. The controller of claim 1, wherein the plurality of chip selection address bits and the plurality of row or column address bits are configurable to different ones of the external address terminals.

3. The controller of claim 1, wherein the plurality of chip selection address bits comprises three chip selection address bits.

4. The controller of claim 3, wherein the plurality of DRAM chips comprises eight DRAM chips.

5. The controller of claim 1, wherein the external command is a read command and wherein the controller is further configured to receive read data from the bank indicated by the bank selection information.

6. The controller of claim 1, wherein the external command is a write command and wherein the controller is further configured to transmit write data to the bank indicated by the bank selection information.

7. A system comprising:
a stacked DRAM device; and
a controller;
wherein the controller is configured to provide bank selection information to the stacked DRAM device by:
transmitting an external command to the stacked DRAM device, the external command including a row address strobe signal, a column address strobe signal, a write enable signal, and a chip select signal;
transmitting an external address to the stacked DRAM device, the external address including a plurality of chip selection address bits, a plurality of row or column address bits, and a plurality of bank selection address bits; and
causing a DRAM chip identified by the plurality of chip selection address bits to:
store an indication of the bank selection information in a register in response to the indication being received concurrently with activation information corresponding to the bank selection information; and
activate a bank identified by the plurality of bank selection address bits.

8. The system of claim 7, wherein the plurality of chip selection address bits and the plurality of row or column address bits are configurable to different ones of the external address terminals.

9. The system of claim 7, wherein the plurality of chip selection address bits comprises three chip selection address bits.

10. The system of claim 7, wherein the plurality of DRAM chips comprises eight DRAM chips.

11. The system of claim 7, wherein the external command is a read command and wherein the controller is further configured to receive read data from the bank indicated by the bank selection information.

12. The system of claim 7, wherein the external command is a write command and wherein the controller is further configured to transmit write data to the bank indicated by the bank selection information.

* * * * *